United States Patent
Buddgard et al.

(10) Patent No.: US 11,217,716 B2
(45) Date of Patent: Jan. 4, 2022

(54) TAPE FOR INTERCONNECTING SINGLE SOLAR CELLS INTO SOLAR CELL MODULES

(71) Applicant: JB ECOTECH AB, Lidingo (SE)

(72) Inventors: Jonas Buddgard, Lidingo (SE); Torgny Lagerstedt, Stockholm (SE)

(*) Notice: Subject to any disclaimer, the term of this patent is extended or adjusted under 35 U.S.C. 154(b) by 145 days.

(21) Appl. No.: 16/649,285

(22) PCT Filed: Oct. 12, 2018

(86) PCT No.: PCT/SE2018/051045
§ 371 (c)(1),
(2) Date: Mar. 20, 2020

(87) PCT Pub. No.: WO2019/078770
PCT Pub. Date: Apr. 25, 2019

(65) Prior Publication Data
US 2020/0279965 A1   Sep. 3, 2020

(30) Foreign Application Priority Data

Oct. 16, 2017 (SE) .................................. 1730285-2

(51) Int. Cl.
*H01L 31/05* (2014.01)
*H01L 31/044* (2014.01)
*H01L 31/18* (2006.01)

(52) U.S. Cl.
CPC ........ *H01L 31/0508* (2013.01); *H01L 31/044* (2014.12); *H01L 31/1876* (2013.01)

(58) Field of Classification Search
None
See application file for complete search history.

(56) References Cited

U.S. PATENT DOCUMENTS

| | | | |
|---|---|---|---|
| 2009/0255565 A1* | 10/2009 | Britt .................... | H01L 31/0512 136/244 |
| 2010/0243027 A1* | 9/2010 | Tsujimoto ....... | H01L 31/022433 136/244 |
| 2012/0006483 A1* | 1/2012 | Hanoka ............... | H01L 31/0547 156/327 |
| 2015/0162472 A1* | 6/2015 | Iyatani ................ | H01L 31/0488 136/251 |
| 2017/0141253 A1* | 5/2017 | Ishii .................. | H01L 31/02013 |

FOREIGN PATENT DOCUMENTS

| | | |
|---|---|---|
| EP | 3 165 361 | 5/2017 |
| SE | 1 430 133 | 3/2016 |
| WO | WO 2012/003099 | 1/2012 |
| WO | WO 2013/112845 | 8/2013 |

* cited by examiner

*Primary Examiner* — Benjamin P Sandvik

(57) ABSTRACT

The invention relates to a method of interconnecting photovoltaic cells into a module by using a tape carrying tabbing wires. The tape makes possible to build modules at a reduced cost. In the tape method individual photovoltaic cells (1) are interconnected into modules by using electrical interconnecting conducting strips (21, 43, 52, 74a, 74b) carried by a tape (51). The strips are laid out on the topsides and backsides of the PV cells. The strips are cut in such a manner that the cells will be interconnected in series after lamination. The present invention concerns an improvement of the tape used in the tape method.

20 Claims, 10 Drawing Sheets

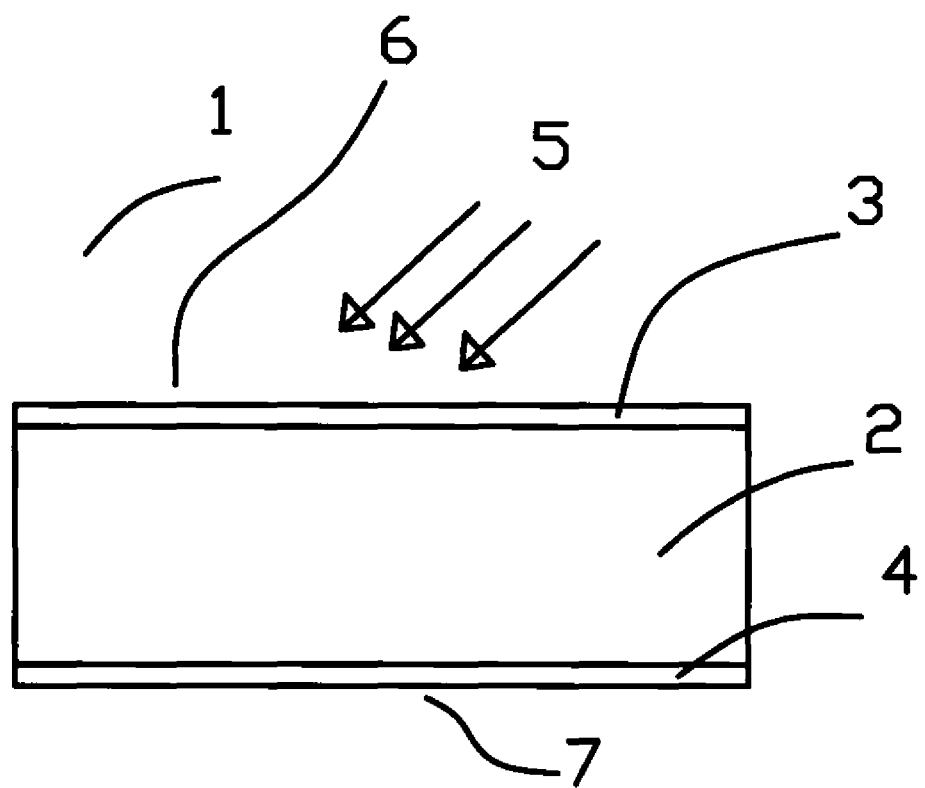
Fig., 1.

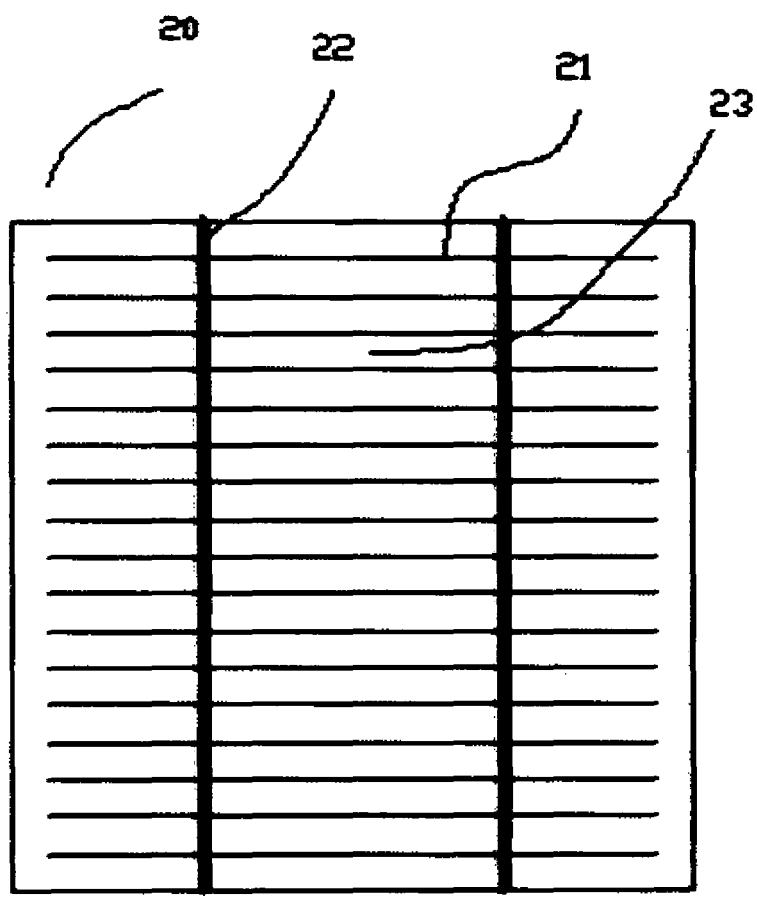
Fig., 2.

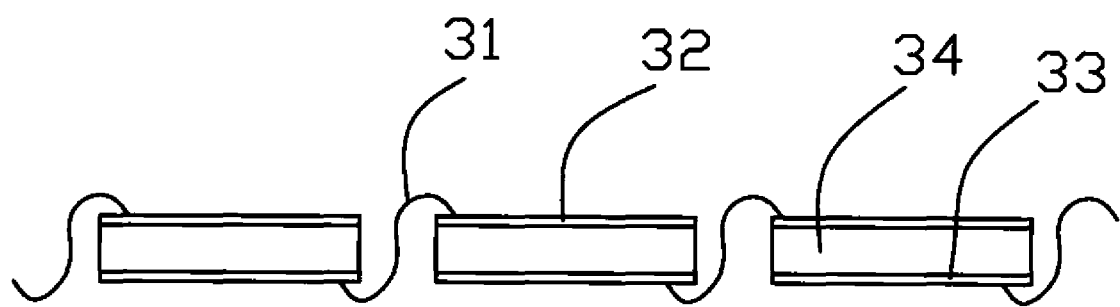
Fig., 3.

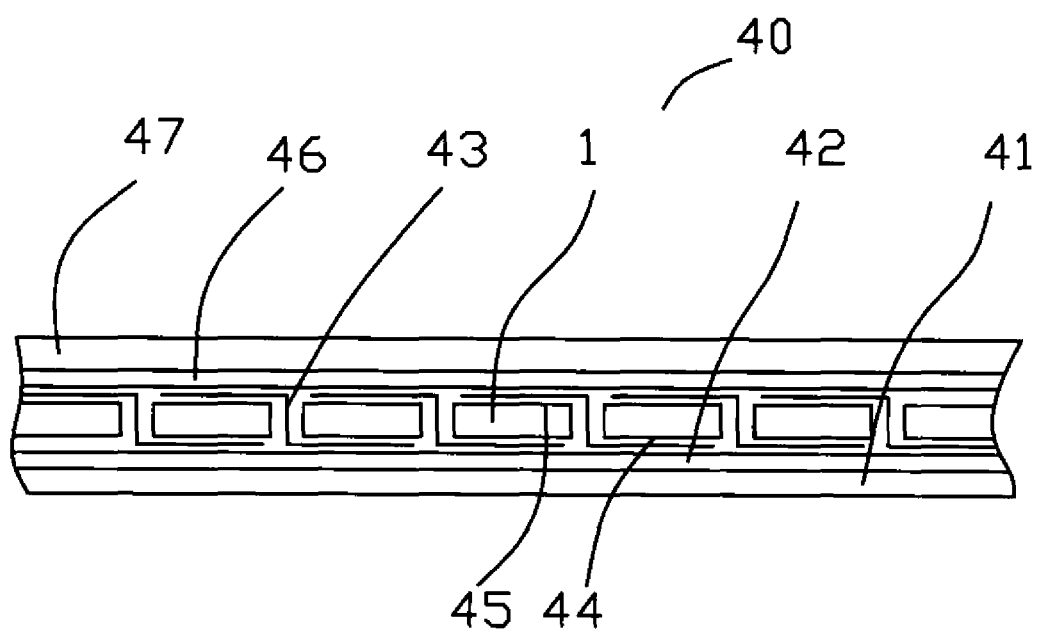
Fig., 4.

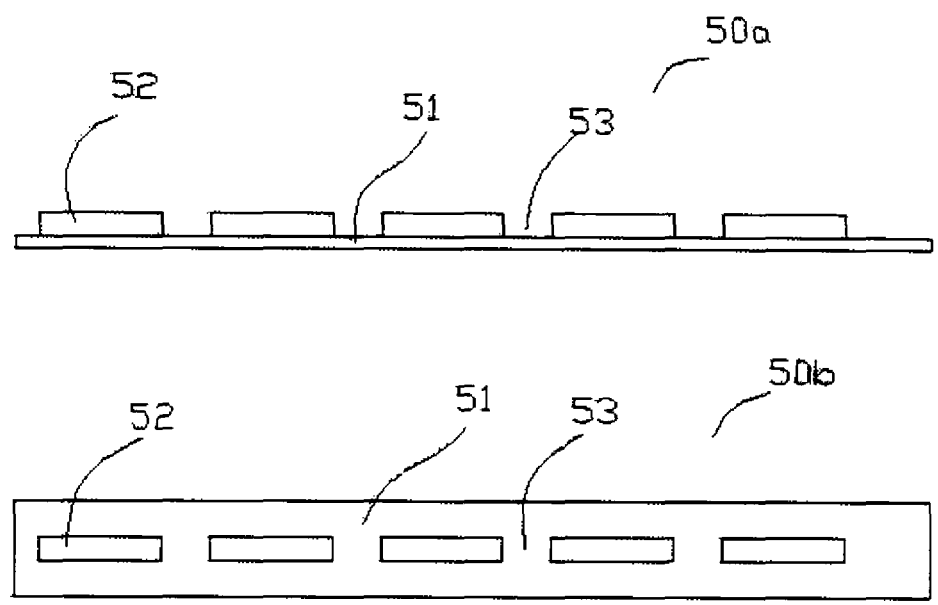
Fig., 5.

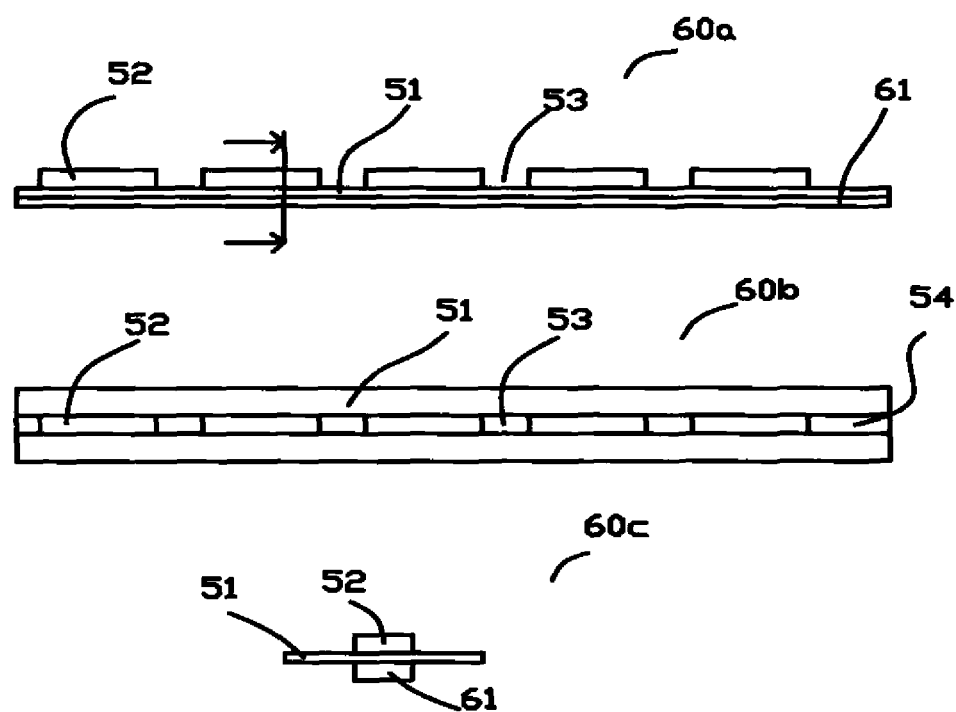
Fig., 6.

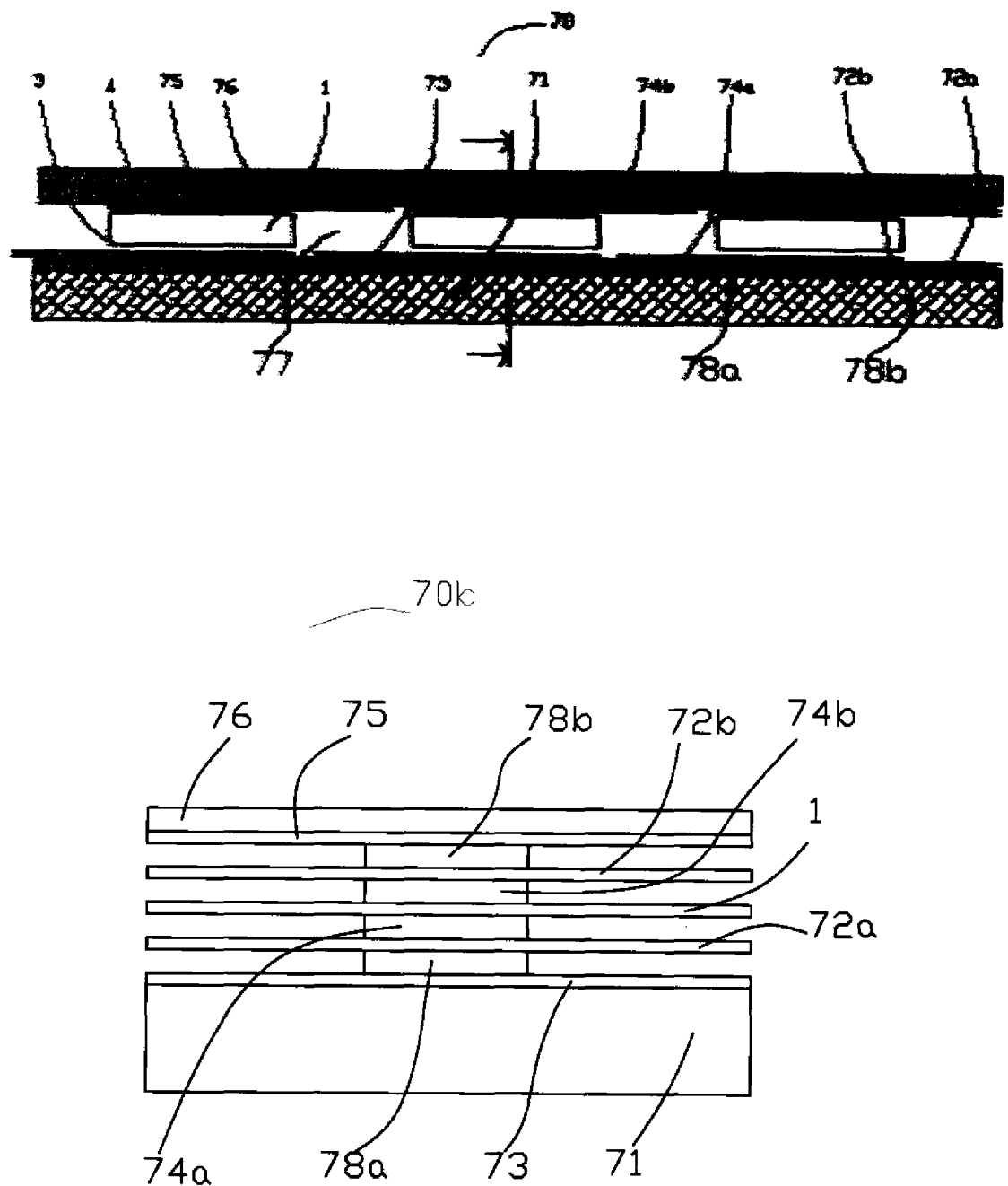
Fig., 7.

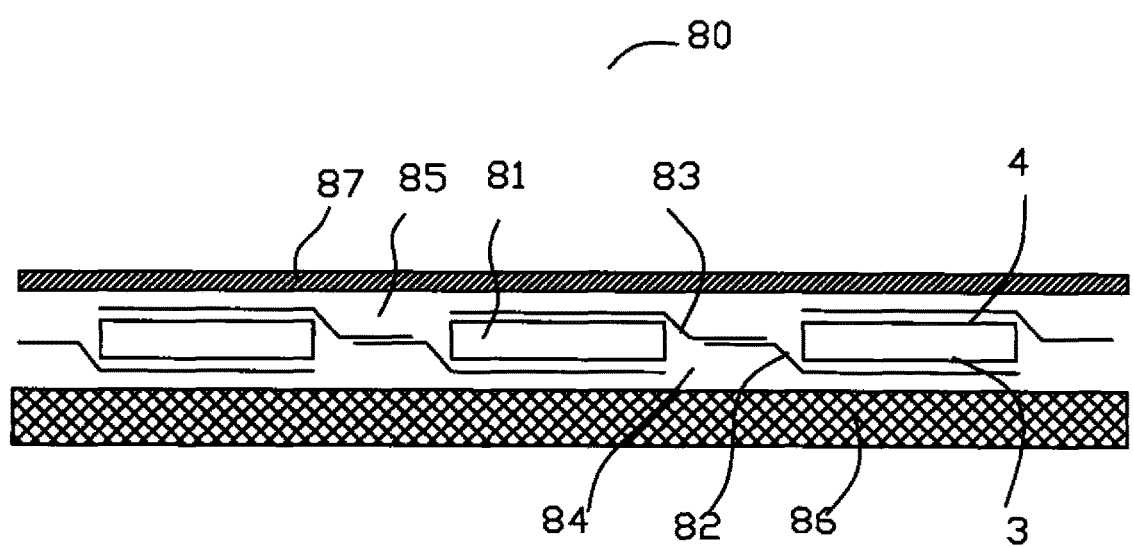
Fig., 8.

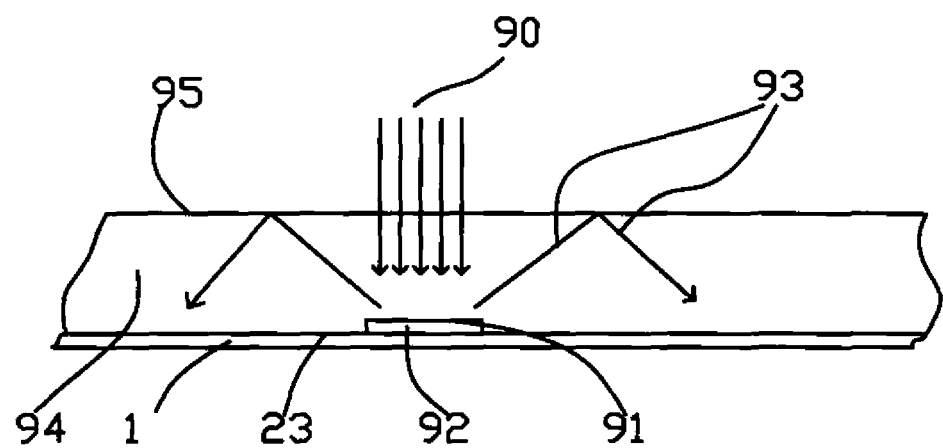
Fig., 9.

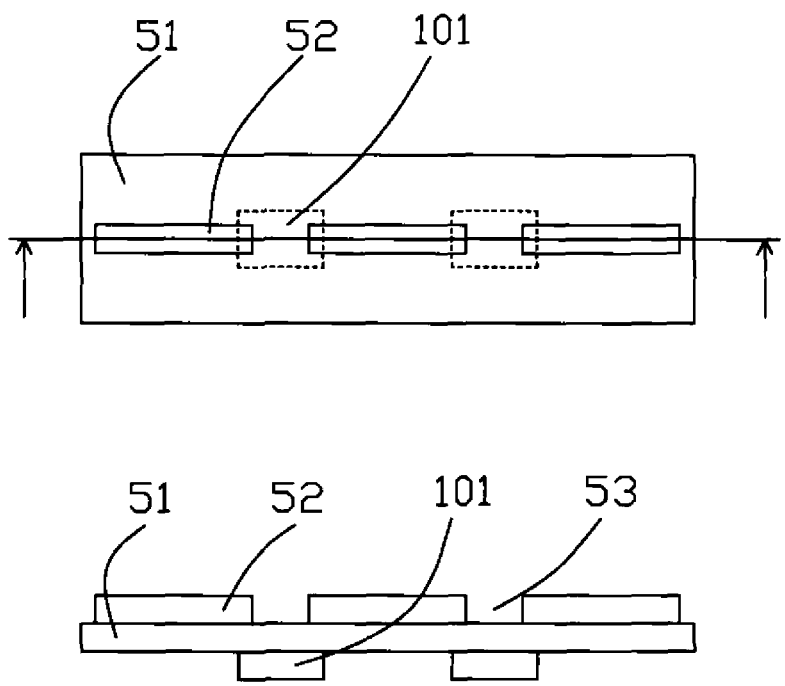
Fig., 10.

TAPE FOR INTERCONNECTING SINGLE SOLAR CELLS INTO SOLAR CELL MODULES

FIELD OF THE INVENTION

The present invention relates to interconnecting individual solar cells into solar cell modules by use of a specially designed tape

BACKGROUND TO THE INVENTION

The invention originates from difficulties in interconnecting individual solar cells into solar cells modules. The solar cells are in literature also called Photovoltaic cells (PV cells) and the solar cell modules are called PV modules. In the following we will use the denominations "PV cells" and "PV modules" or just "cells" and "modules". The interested in using modules for solar power in increasing, but, still the cost of the module is high for the end user. Manufactures of modules are striving to reduce the cost of modules. Interconnection of cells into modules gives considerable contribution to the cost of the module and new methods of interconnection are developed. Interconnection will in the following be called "bonding". The wires used when interconnecting cells will be called "bonding wires" or "tabbing wires. One proposed method is interconnection of cells by using a tape carrying bonding wires. The tape method, as described in patent DE 19652810 A1 has several advantages which will be described later. But, disadvantages hinder use.

The present invention concerns an improvement of the tape used in the tape method. The objective of the invention is the design a tape that can be used in the tape method with a god result.

A more detailed description is given in the following. The layout of the description is:
Description of a PV cell
Description of a PV module
Description of the bonding of PV cells into modules. Both the traditional method and the tape method will be described.
Description of the improved tape, the invention, to be used in the tape method.

PV Cell

The PV cell comprises a number of thin layers on a supporting plate. The layers have different functions which together results in a functional PV cell. There are a number of different types of PV cells, but the two main types are: thin film PV cells and silicon PV cells. In the following we will describe a silicon cell. The incoming radiation from the sun creates a voltage across the active layer in the PV cell and an electric current can be taken from the PV cell via electrical connections on the top- and backside of the PV cell. The topside and backside have different polarities. The topside is the side which receives the incoming solar radiation. The electrical connection on the topside is called topcontact and the contact on the backside backcontact. The connection on the topside is made on a thin transparent layer which is electrical conductive. The transparent conduction layer is called TCO (Transparent Conduction Oxide). The TCO layer is thin and can thus only handle small current densities. Therefore, a matrix (a grid) of highly conducting material is imposed on top of the TCO layer to collect the current. The grid consists of a pattern with fingers and busbars. The fingers are narrow (small width) metallic strips with a width of 0, 1 to 0, 3 mm. The distance between individual fingers is 2 to 10 mm. Busbars are running across and mostly perpendicular to the fingers. The busbars contact the fingers and it is the busbars that conduct the current from the PV cell. The number of busbars is usually two to three but other numbers can be used. The busbars have a width between 1, 5-2, 5 mm but other widths may be used. As noted above the width of the fingers are in the order 0, 1 to 0, 3 mm. The grid with fingers and busbars will however reduce the efficiency of the PV cell because the nontransparent material in the grid shades the surface of the PV cell from the solar radiation. In the making of the PV cell, it is thus important to have a small as possible shading area from the grid. It is essential to choose a material in the grid that has a high conductivity for the electrical current. The material in the grid on the PV cells today is silver. Other materials are possible but they have disadvantages. The grid pattern is applied by screen printing a silver paste on top of the PV cell.

The cost of the silver in the grid is emerging as a dominant cost. It can also be noted that the prize on silver is not expected to go down in the future. The tape method, which will be described later, makes it possible to reduce the amount of silver used. Also, the method of bonding is simplified. The backside of the PV cell do not need to be transparent to light and the contact on the backside can be made on a metalized surface that partially or completely covers the backside of the PV cell. Other material than silver are used on the backside of the PV cell. A commonly used material is aluminum.

Module

A number of individual PV cells are electrical connected to each other to form a PV module. The PV cells are interconnected in series in which the positive electrode (usually the backside of the PV cell) is connected to the negative electrode of the PV cell (usually the topside of the cell) of a neighbor cell. The cells are placed in a row and the cells in the row are as said above interconnected in series. In this it is the busbars on the topside of the PV cell which is connected to the metalized backside. The number of cells in the row may vary but a typical number is 10. The cell voltage of an individual cell is of about 0, 5 volts. Ten cells interconnected in series thus have a voltage of 5 volt. Six of the rows described above are placed close and parallel to each other to form the module. The distance between two rows is usually between 2 to 10 mm but other distances may be used. The rows are then interconnected in series and 6 rows with 10 cells in each row give a module having a voltage of 30 volt and a surface area of 1, 6 m$^2$. The description above describes a typical PV module but other modes of interconnections and other numbers of PV cells in the module than that described above can be used. PV cells and the row of PV cells are strengthened and mechanically supported by different sheets in the process of production which will be described in the next section.

The Traditional Production Method Used Today

The electrical interconnection of PV cells to form a module is today achieved in a rather complicated process. This process and the different steps used in the production are, in detail, described below.

Again we note that the individual PV cells are interconnected in series and the positive electrode on one PV cell is connected to the negative electrode on a neighbor PV cell or the other way around. And that the positive electrode is on one side of the cell (usually on the backside) and that the negative electrode is on the other side (usually the topside) of the PV cell. The cells are bonded together with an interconnecting electrical conduction strip that runs from the topside of one PV cell to the backside of a neighbor PV cell.

This electrical conduction strip is called tabbing wire. In the following text we will use tabbing wire when referring to the "interconnecting electrical conduction strip". Further, it can be noted that certain types of PV cells can be manufactured in such a manner that the topcontact of the PV cells is draw through the PV cell to the backside of the cell. Still, the plus and minus electrodes have to be interconnected in series. In the ensuing description we will describe interconnection of PV cells which have a topcontact on the topside and a backcontact on the backside. But, it can here be noted the invention also can be used to connect PV cells having electrodes on one side only.

The first step in the production of a module is to place one PV cell on a carrier plate. The backside of the cell is facing the carrier plate. Tabbing wires are placed on the PV cell, perpendicular to the fingers and on the busbars. The fingers and busbars are earlier described in the description of the PV cell. The number of tabbing wires is usually two or three (the same as the number of busbars). The tabbing wires extend across the length of the topside of the PV cells and further a free length which is the same as the length of a PV cell. The "free length" of the tabbing wire will not, at this stage, be in contact with a PV cell. The next step in the production is to place a second PV cell on the carrier plate close to the first PV cell and on the above said tabbing wire. The backside of the second PV cell will now be on and in contact with the earlier mentioned free length of the tabbing wire. Thus, an electrical connection is established between the topside of one cell and the backside of a neighbor PV cell via the tabbing wire. The procedure is repeated and tabbing wires are placed on the topside of the second PV cell and the tabbing wire extends across the topside of the second cell plus the above described free length. Cell number three is now placed on the free length of the tabbing wire. The process is now repeated until a row with the desired number (usually 10) of PV cells is obtained. The tabbing wires are soldered to the topside and backside of the PV cells. This soldering is usually made after each placing of a PV cell on the carrier plate. The soldering can also take place after a complete row has been laid out.

The row of PV cells is now moved to and placed with the topside down on a sealing sheet which in turn rests on a topglas. The topside of the PV cells is the side which receives the incoming solar radiation. Note here that the topglas is facing down in the further building of the module. On the topglas there is as mentioned above a sealing sheet which is of a polymer material. The most common material in the sealing sheet is a material called EVA (Ethylene Vinyl Acetate) but other materials can be used. In the ensuing building of the module a second row of PV cells will be placed along and parallel to the first row. The second row of PV cells comprises a row of PV cells interconnected with tabbing wires in the same manner as the first row. This process continuous until the desired number (usually 6) of rows in the module is reached. The rows are connected in series in a soldering process and outgoing contacts for the completed module are soldered in place. The module with the PV cells is covered with a second sealing sheet (EVA). The second sealing sheet is of the same type as the above mentioned first sealing sheet which is resting on the topglas. The second sealing sheet is thereafter covered with a backsheet of a suitable material. This backsheet faces the outer environment and is the backside of the module. The complete module with topglas, sealing sheet 1, PV cells with interconnecting tabbing wires, sealing sheet 2 and backsheet is heated (baked) in vacuum at a temperature of 150° C. In the baking the sealing sheets softens, melts and fix the module into a robust and sealed unit that can withstand the outer environment. The baking process is also called "lamination".

A more detailed description of the lamination is given in the following.

The complete module with topglas, sealing sheet 1, PV cells with interconnecting tabbing wires, sealing sheet 2 and backsheet is placed on a heated (150° C.) plate in a laminator chamber. The chamber is closed and evacuated to vacuum. The vacuum chamber has a rubber membrane in the lid at the inside of the vacuum chamber. At start of the lamination process the membrane is sucked up against the lid by the vacuum. When the chamber is evacuated the space between the lid and the membrane is opened to the ambient air and the membrane will, due to the vacuum in the chamber, push the module against the heated lower part of the chamber. This "push" will be exerted on the module for about 10 minutes. The push and the heat will soften and melt the sealing sheets and fix the module to a robust unit. The vacuum in the chamber is vented, the chamber is opened, and the finished module is removed from the chamber.

Finally, it is noted that placing and soldering of tabbing wires to the topside of the PV cells has to be made on to busbars on the PV cells. Soldering to the finger only will not work because the mechanical strength will be to low and the fingers will be torn lose from the topside of the PV cell when handling. I.e., when the row comprising 10 cells is moved to the topglas with the sealing sheet. That is, busbars are needed and the tabbing wires are soldered to the busbars. With the tape method, the busbars on the PV cells will not be needed as explained below.

Tape Method

To avoid lifting of a finished row of cells for the placement on the topglas the tape method can be used. With the tape method the cells are assembled on the topglas from start. In the tape method are the tabbing wires interconnecting cells carried by a tape. The tabbing wires carried by the tape are interrupted at certain intervals in a pattern that enables an interconnection of the PV cells in series. With "interrupted" is here meant that the tabbing wire is cut with a gap between the ends in the cuts. The final interconnection of all of the PV cells in the module and closing of the electrical circuit is obtained in the laminating step. This will be further clarified when describing the productions steps used in the tape method. The tabbing wires can also be attached and integrated on the earlier described sealing sheets which are used in the manufacturing process. The sealing sheets have thus already in the manufacturing of the sealing sheets been furnished with tabbing wires which are interrupted in such a manner that an interconnection between PV cells is obtained in the lamination. Tape with tabbing wires can also be used to interconnect assembled rows of PV cells in a final interconnection of the PV module. That is, tape or sealing sheets with tabbing wires do not only interconnect PV cells in a row but also interconnect rows. The Tape Method (TM) is preferably suited to use there the individual PV cells have their plus and minus electrodes on the top- and backsides, respectively. In this case tape/sheets with tabbing wires will be applied both on the topside and the backside of the PV cells. However, the TM can be used to interconnect PV cells having plus and minus electrodes on one side of the PV cell. In the following we will describe a manufacturing method that can be used with the TM. The process starts with a topglas being put on a carrier in the process line. A first sealing sheet (EVA) is placed on the topglas. Tapes carrying tabbing wires are placed on the sealing sheet. The number of tapes used may vary depending on the number of tabbing wires to be used. Also, one wide tape can carry several tabbing wires. The tape is made out of a suitable materiel i.e. a polymer but other materials may be possible. The tape with tabbing wires stretches a length along two PV cells or more, preferably along a length given of the length of the module with final number of PV cells in the row with PV cells. The tabbing wires consist of a material that can conduct current. The material in the tabbing wire is preferably solderable to the fingers. The solderability to the fingers is not needed if a good electrical contact between finger and tabbing wire can be obtained. The tape with the tabbing wires is placed on the sealing sheet with the tabbing wires on the top of the tape. That is, the tabbing wires are not facing the sealing sheet. The tape can also have an adhesive applied on one or both sides of the tape. This ensure a good fixing of the tape to the sealing sheet or/and the PV cell. The tabbing wires are at regular intervals cut with a distance between cuts which is of the same order as the width of the PV cell. The cut of the tabbing wire is made with a small gap. Here it shall be noted that the above described tabbing wires are carried by a tape and that the tape also can be seen as a sheet carrying a number of tabbing wires. I.e. the tape can be a sealing sheet that carries the tabbing wires.

Now we return to the building of a module. The desired number (usually 10) of PV cells in a row is now placed with the topside down and facing the tape with tabbing wires. The cells in the row are separated with a small distance between the PV cells and that sections of the tabbing wires are free. That is, a part of the tabbing wire is not covered by the PV cell and this free part of the tabbing wire extends over the free space between two PV cells. The building of the module continues and a second set of tape with tabbing wires is placed on top of the PV cells that just have been placed in a row. The tabbing wires in the second set are now resting on and contact the backcontacts on the backsides of the PV cells. The material in the tabbing wire can preferably be soldarable to the material in the backcontact. The tape with tabbing wires can have the same design as the former described tape which used on the other side of the PV cell. The tape with tabbing wires that is placed on the backside of the PV cells have a part of the tabbing wire that extends across of the free space between two PV cells. We now have tabbing wires on the topside and on the backside of the PV cells and that a part of the tabbing wire on the two sides of a cell overlaps in the free space between two PV cells. By foregoing the later description we can note that it is these overlapping tabbing wires that contact each other in the process of lamination thus forming the contact in series between the plus and minus electrodes of two adjacent PV cells. The process above is now repeated until the wanted number of rows in the module is obtained. An alternative is to place all the PV cells on a topglas on which a tape with tabbing wires has been laid out. Thereafter, the backside of the cells is contacted with tapes having tabbing wires.

When all the PV cells have been placed, the process continues with a sealing sheet that covers the PV cells in the module. This is not needed if a sealing sheet having tabbing wires already has been placed on the PV cells. Finally, a backsheet is placed on top. It is noted that tabbing wires carried by tapes also can be used to interconnect the rows in series and that the final interconnection of the rows takes place in the step of lamination.

The module is now ready for the baking process, the lamination. The lamination, done at a temperature of about 150° C., is as described earlier. At the temperature of 150° C. the sealing sheets soften and melt. The earlier described push from the outside and the vacuum on the inside will bring the free tabbing wires in the space between the PV cells in contact with each outer. We shall also note the distance between two cells is usually between 2 to 10 mm and the thickness of PV cell is of about 0, 2 mm. That is, the free tabbing wires just have to be pushed 0.2 mm to be in contact. During the pushing and heating the tabbing wires also contact the fingers on the topside and the metalized backside of the PV cells.

Preferably, can the tabbing wires be furnished with a solder that melts and solders at the lamination temperature and thus the tabbing wires are soldered to each other, to the fingers and to the backcontact. Once again we note that the outside push and the vacuum have brought the free parts of the tabbing wire in the space between PV cells in contact with each other.

A variant of the TM is to use sealing sheets that already have tabbing wires. That is, the sealing sheets have in the manufacture of the sealing sheets been supplied with tabbing wires. In this case all of the PV cells are distributed directly on first sealing sheet having tabbing wires. Thereafter, are the PV cells covered with a sealing sheet number two which also has tabbing wires. This is followed by the backsheet and after that lamination.

Above it is described how a tape with having tabbing wires interrupted at certain intervals is used. But it is also possible to cut the wires after a tape with continuous wire being placed on the modules as described in the patents SE 1430133.

The module is, with the tape method, built directly on the topglas and no handling or lifting of the rows is needed and thus, busbars are not needed. It can also be noted that no intermediate soldering is needed.

Tape, according to the invention, to be used in the Tape Method.

The tape method facilitates a more efficient way of interconnecting PV cells. Also, the amount of silver can, as said earlier, be reduced because busbars of silver are not needed. But still, the tape method is not used in the manufacture of modules. One reason for this is problems with the contact between tabbing wire and the topside and the backside of the cells. Also, the contact between tabbing wires that interconnects the cells can be problematic. It has been found that, the tape method produces modules that operate as specified when new. But, when the modules have been subjected to thermal cycling the efficiency deteriorates. Thermal cycling means that the modules are subjected to temperature variations. In installations the temperature difference between night and day can be as high as 70 C°. This results in considerable thermal stress in the module which deteriorates the contacts.

Three major problems are identified. The problems are:

I

The contact between the tabbing wire carried by the tape and the top- and backside of the PVcell deteriorates with time. With "deteriorate" is here meant that the contact resistance increases. Especially the connection to the top-contact is affected by thermal cycling. But, the contact resistance to the backcontact may also increase. An increased contact resistance reduces the efficiency of the module.

II

The free ends of the tabbing wires between the PV cells have a short distance between the tabbing wires at the start of the lamination. This distance has to be closed in the lamination. Even if the distance is short it has been found that the closing can be faulty.

III

The tape with the interrupted (cut) tabbing wires is made by stamping cuts in the tabbing wires and also the tape. This leaves holes in the tape. In the process of lamination melted EVA will enter through the holes and flow between the ends of tabbing wires which hinder a soldering between the tabbing wires.

An improved tape, according to the invention, will meet the problems I, II and III. The improved tape has, as before, a tape 1 which carries tabbing wires. But the tape is improved by having an extra tape, tape 2, on top of tape 1. Tape 2 is preferably applied on tape 1 after the interruptions of the tabbing wires has been cut. Tape 2 has a width of order of the width of the tabbing wire and extends along the total length of tape 1. That is the combined tape 1 and 2 is thicker over the tabbing wire. This will in the process of lamination give an extra pressure on the tabbing wires which enables a better contact and thus at better soldering. This will solve problem I, II, above. Also, the holes in tape 1 will be covered and EVA will not, during the process of lamination, enter through the holes and hinder contact between tabbing wires. Thus, the extra tape solves problem III.

The extra tape, tape 2, that covers tabbing wires can also be furnished with additional functionality such as: The extra tape can have a layer that reflects the light that hits the extra tape. The reflected light is reflected at an angle to the top of the topglas and re-reflected back to a part of the PV cells which is not shaded by the tabbing wire. This will increase the efficiency of the PV cell and thus also the efficiency of the module. Here it can be noted that the tabbing wires can shade 3 to 6% of the surface of the PV cell. A reflective surface on the tape 2 may reduce the shading by half. The reflective surface can be a direct reflective surface (a mirror surface) or surface with a diffuse reflection (a "white" surface).

The extra tape can also be made of or coated with a material that has a thermochromic property. That is, the extra tape can be used as a temperature sensor. This can be used in order to detect faulty PV cells.

Other functionalities can also be in-cooperated in the extra tape. Such as bypass diodes. Bypass diodes are used to shortcut shaded or faulty cells.

SUMMARY OF THE INVENTION

The objective of the invention is to achieve an improved tape to use in the tape method for interconnecting individual PV cells into a PV module. The tape method in itself enables a substantial reduction of cost of the process of interconnection and also a reduction of cost for the material used in the topcontact on the PV cell. According to the presented invention the improved tape set forth by description is characterized of features of claim 1 in which an extra strip of tape is placed on the tape carrying the tabbing wire and on and above the tabbing wire. This will during lamination give an additional pressure on the point of contacts to the PV cell and also on the contact between tabbing wires The invention also relates to a method according to claim 2 in which the extra tape is used on topside only.

The invention also relates to a method according to claim 3 in which the extra tape is used on backside only.

The invention also relates to a method according to claim 4 in which the extra tape is applied as discontinuous strips.

The invention also relates to a method according to claim 5 in which the extra tape is applied after the first tape has been laid out on the PV cells.

The invention also relates to a method according to claim 6 in which the tabbing wires are cut after the improved tape has been laid out.

The invention also relates to a method according to claim 7 in which the extra tape on the topside has a reflective surface.

The invention also relates to a method according to claim 8 in which the extra tape on the topside has thermochromic properties.

The invention also relates to a method according to claim 9 in which the extra tape carries bypass diodes.

BRIEF DESCRIPTION OF THE DRAWINGS

FIG. 1 shows a Photovoltaic Cell (PV cell) with an active layer, a topcontact, and a backcontact.

FIG. 2 shows the contact pattern (the grid) used to transport current from the topside of a PV cell.

FIG. 3 shows the interconnection in series between the topcontact and backcontact of PV cells.

FIG. 4 shows a module with tabbing wires drawn between the PV cells.

FIG. 5 shows a tape with tabbing wires used to interconnect AV cells. The figure shows a side view and a top view of the tape before improvement.

FIG. 6 shows a tape according to the invention. The figure shows a side view, a top view and a cross section.

FIG. 7 shows a module with the improved tape.

FIG. 8 shows a module after lamination.

FIG. 9 shows how a reflective layer on the extra tape reflects light to an unshaded part of a PV cell, FIG. 10 shows an improved tape with short pieces of extra tape.

DETAILED DESCRIPTION OF PREFERRED EMBODIMENTS

FIG. 1 shows a PV cell 1 having an active layer 2, a topcontact 3 and a backcontact 4. Topside 6 receives incoming solar radiation 5. The solar radiation is schematically shown with arrows. FIG. 1 also defines a backside 7 of the PV cell. The incoming solar radiation 5 generates a voltage in the active layer. The voltage sets up a current which is led from the PV cell via the topcontact 3 and the backcontact 4. FIG. 1 shows a PV cells having the topcontact and the backcontact on the two sides of the PV cell. There are also PV cells in which the topcontact 3 has been led down to the backside 7 of the PV cell. This is not shown in a figure.

FIG. 2 shows a PV cell 20 on which a grid has been applied on the PV cell. The figure shows the topside 6. The grid comprises fingers 21 and busbars 22. Figure also has a pointer 23 which indicates the part of the topside which is not covered (shaded) by the grid). FIG. 2 show a common pattern of a grid on a PV cell but other types of patterns may occur.

FIG. 3 shows how PV cells 34 are interconnected in series via tabbing wires 31 which extends from an electrode 33 having positive polarity (plus electrode) to an electrode 32 having negative polarity (minus electrode). FIG. 3 shows a PV cell having electrodes on each side of the PV cell.

FIG. 4 shows a module build with the traditional method in which a continuous tabbing wire is drawn from a topcontact of one PV cell to the backcontact of a neighboring PV cell. PV cells 1 are assembled into a module 40. FIG. 4 only shows a side view of a section of a row with a number of the PV cells 1. The module has a topglas 41, a first transparent sealing sheet 42. The sealing sheet 42 is usually made a polymer material called EVA (Ethylene Vinyl Acetate). Solar radiation passes through the topglas and the sealing sheet 42. The individual PV cells 1 in the module are interconnected via tabbing wires 43. The tabbing wires 43 extend from a plus electrode 45 to an adjacent PV cells minus electrode 44. Depending on type of PV cell the polarity can be reversed. On the PV cells there is a second sealing sheet 46. The assembly of the module is finished with a backsheet 47. After this the module is baked in a laminator, not shown with a figure. FIG. 4 only shows a part of a row in a complete module. A complete module usually has 6 rows with ten PV cells in each row. For clarity it shall be pointed out that FIG. 4 shows the module with distorted scales. The actual PV cell 1 has in reality a thickness of about 0, 2 mm and the length of the cell is 156 mm. The distance between two adjacent cells is of about 2 to 10 mm.

FIG. 5 shows a tape used with the tape method. The figure shows a side view 50*a* and a top view 50*b* of a tape 51 carrying tabbing wires 52. The tabbing wires 52 are electrical conduction strips in a metallic material that interconnects PV cells and conduct current between cells. The tabbing wires can have a solder which enables the tabbing wires to be soldered to each other and also soldered to the topcontact 3 and the backcontact 4. The solder can be Bi/Sn but other solders are possible. The tabbing wires are cut with a certain gap 53 between the cuts. The lengths of the tabbing wire between cuts are indicated in FIG. 7. The cuts make it possible to interconnect the topside and backside of the PV cells in the lamination step. This interconnection is further clarified in FIGS. 7 and 8. The FIG. 5 shows the carrier of the tabbing wires 52 as a rather narrow tape 51. The tabbing wires can also be carried by a wide tape that carries a plurality of parallel tabbing wires. Not shown with a figure. The tabbing wires can also be carried by sealing sheets.

FIG. 6 shows a top view 60*a*, a side view 60*b* and a cross section 60*c* of the improved tape, according to the invention, with an extra tape 61 on tape 51. The extra tape 61 imposes an additional pressure on the tabbing wires 52 during bonding. This enables a better contact between the tabbing wire and the backcontact and topcontact of the PV cell. Contact between tabbing wires is also improved. The extra tape 61 on the topside can have additional functionality such as redirecting light that hits the tabbing wire to unshaded parts of the PV cell. This is further described in FIG. 9. Further, the extra tape 61 can furnished with or made out of a thermocromatic material. Thus, making it possible to observe the temperature of the PVcells. The extra tape can also carry bypass diodes. Bypass diodes are used to short cut nonfunctional PV cells.

The extra tape can be used on one side of the PV cells only or on both sides.

FIG. 7 shows a shows a side view 70*a* and a cross section 70*b* of a module with a tape according to the invention with tabbing wires 74*a* and 74*b* carried by tape or sheets 72*a* and 72*b*. The module is shown before lamination. The figure also shows a topglas 71 which receives the incoming solar radiation. A sealing sheet 73 is placed in the topglas 71. On top of the sealing sheet 73 there is the sheet 72*a* with the tabbing wires 74*a* and the extra tape 78*a*. The tabbing wire 74*a* contacts the topcontact 3. The PV cells are separated by a gap 77. The second sheet 72*b* with the tabbing wires 74*b* and extra tape 78*b* is placed on the PV cells. Thereafter, a second sealing sheet 75 is placed on the sheet 72*b* and the second sealing sheet 75 is covered with a backsheet 76. The sheets 72*a*, 72*b* can also be integrated into the sealing sheets 73, 75. FIG. 7 shows a module before lamination. The module after lamination is showed in FIG. 8. We can already here note that it is the free part of the tabbing wires 74*a* and 74*b* that contacts each other in the gap 77 during lamination. The extra tape and the position of the extra tape is indicated with pointers 78*a* and 78*b*. The extra tape is more clearly shown in the cross section 70*b*.

FIG. 8 shows a module 80 after lamination with PV cells 81 interconnected by tabbing wires 82, 83 which are carried by the sheets 72*a*, 72*b*, and the tape 51 or directly by the sealing sheets 73, 75. The tabbing wire 82 contacts the topcontact 3 and the tabbing wire 83 contacts the backcontact 4. FIG. 8 shows the module after lamination and the tabbing wires 82, 83 are now brought in contact with each other in the gap 77 and a contact in series between individual PV cells has been obtained. The sealing sheets 73, 75 have softened, melted, and filled the gap 77 between the PV cells. The melted sealing sheet is indicated with pointers 84, 85. For clarification consult FIG. 7 in which the sealing sheets, tape and extra tape are shown before lamination. In the figure the tape 72*a*, 72*b* extra tape 78*a*, 78*b* have merged with the melted sealing sheet and are thus not seen in FIG. 8.

FIG. 9 shows how incoming light is reflected from a surface 91 on extra tape 92 by diffuse reflection. The path of the reflected light is shown with light arrows 93. The reflected light hits unshaded parts 23 of the PV cell 1. The figure also shows a topglas 94 and a surface 95 of the topglas 94. For clarity FIG. 9 shows PV cells, extra tape and topglas only.

FIG. 10 shows a top view and a cross section of an improved tape with an extra tape in the form of short pieces of tape 101. The short pieces are placed over the gap 53.

In the description of the invention of the improved tape it is noted the improved tape also can be used to interconnect row of cells. Such an interconnection is not shown with a figure. An interconnection of rows in series does not differ from interconnecting individual PV cells in series. We can refer to FIG. 8 in which interconnection of PV cells in series is shown. FIG. 8 can also be seen as an interconnection of rows in series there the individual PV cell can be seen as a row extending into the plane of the drawing.

The invention claimed is:

1. Method of electrical interconnecting individual Photovoltaic solar cells, PV cells, used in the making of a PV module, wherein said PV module comprises a topglas (41, 71, 86, 94), sealing sheets (42, 46), a number of PV cells (1) and a backsheet (47, 87), wherein the PV cells, with topside (6) and a backside (7) have an active (2) layer in which an electrical current is generated, a topcontact (3) on the topside (6) and a backcontact (4) on the backside (7) and electrical current is drawn from the PV cell via the backcontact and topcontact, wherein the PV cells are placed in rows with a space (77) between individual PV cells in the row and the rows are placed with a distance between the rows, wherein said PV cells are interconnected by tabbing wires (31, 43) of an electrical conductive material and said tabbing wires are carried by tape (51) and the tabbing wires (52, 74*a*, 74*b*) carried by the tape (51) contacts the topside (6) and the backside (7) of the PV cells, characterized in that the tape (51) carrying the tabbing wires have an extra continuous strip of tape (61) positioned on the first tape (51) and that the extra continuous strip of tape completely or partly covers the tabbing wire (52) and that the extra continuous strip of tape (61) stretches along the tabbing wire (52).

2. Method according to claim 1, characterized in that the tape (51) with the extra continuous strip (61) of tape is placed on the topside (6) of the PV cells (1) in the module (70).

3. Method according to claim 1, characterized in that the tape (51) with the extra continuous strip (61) of tape is placed on the backside (7) of the PV cells (1) in the module (70).

4. Method of electrical interconnecting individual Photovoltaic solar cells, PV cells, used in the making of a PV module, wherein said PV module comprises a topglas (41, 71, 86, 94), sealing sheets (42, 46), a number of PV cells (1) and a backsheet (47, 87), wherein the PV cells with topside (6) and a backside (7) have an active (2) layer in which an electrical current is generated, a topcontact (3) on the topside (6) and a backcontact (4) on the backside (7) and electrical current is drawn from the PV cell via the backcontact and topcontact, wherein the PV cells are placed in rows with a space (77) between individual PV cells in the row and the rows are placed with a distance between the rows, wherein said PV cells are interconnected by tabbing wires (31, 43) of an electrical conductive material and said tabbing, wires are carried by tape (51) and the tabbing wires (52) carried by the tape contacts the topside (6) and the backside (7) of the PV cells, characterized in that the tape (51) carrying tabbing wires (52) have short discontinuous extra strips of tape (101) placed on the tape (51) and above the tabbing wires 52 and the extra strips of tape stretches over a gap (53) between cut tabbing wires cells and that the extra strips completely or partly cover the tabbing wires.

5. Method according to claim 1, characterized in that the extra continuous strip of tape (61) is placed on the tape (51) after the tape (51) is placed on the PV cells (1).

6. Method according to claim 1, characterized in that a gap (53) in the tabbing wire (52) is are made after the tape (51) with the extra continuous strip tape (61) has been laid out on the backside (7) and topside (6) on the PV cell.

7. Method according to claim 1, characterized in that an extra continuous strip of tape (92) on the topside (6) has a surface structure (91) that enables the light hitting the extra tape to be redirected to a part (23) of the topside (6) of a PV cell (1) which is not covered by the tabbing wires (31, 43).

8. Method according to claim 1, characterized in that the extra continuous stop of tape (61) used on the topside (6) has a thermochromic property.

9. Method according to claim 1, characterized in that the extra continuous strip of tape (61) can Function as a bypass diode.

10. Method according to claim 2, characterized in that the extra continuous strip of tape (61) is placed on the tape (51) after the tape (51) is placed on the PV cells (1).

11. Method according to claim 3, characterized in that the extra continuous strip of tape (61) is placed on the tape (51) alter the tape (51) is placed on the PV cells (1).

12. Method according to claim 2, characterized m that a gap (53) in the tabbing wire (52) is made after the tape (51) with the extra continuous strip tape (61) has been laid out on the backside (7) and topside (6) on the PV cell.

13. Method according to claim 3, characterized in that a gap (53) in the tabbing wire (52) is made after the tape (51) with the extra continuous strip tape (61) has been laid out on the backside (7) and topside (6) on the PV cell.

14. Method according to claim 5, characterized in that a gap (53) in the tabbing wire (52) is made after the tape (51) with the extra continuous strip tape (61) has been laid out on the backside (7) and topside (6) on the PV cell.

15. Method according to claim 2, characterized in that an extra continuous strip of tape (92) on the topside (6) has a surface structure (91) that enables the light hitting the extra tape to be redirected to a part (23) of the topside (6) of a PV cell (1) which is not covered by the tabbing wires (31, 43).

16. Method according to claim 3, characterized in that an extra continuous strip of tape (92) on the topside (6) has a surface structure (91) that enables the light hitting the extra tape to be redirected to a part (23) of the topside (6) of a PV cell (1) which is not covered by the tabbing wires (31, 43).

17. Method according to claim 2, characterized in that the extra continuous strip of tape (61) used on the topside (6) has a thermochromic property.

18. Method according to claim 3, characterized in that the extra continuous strip of tape (61) used on the topside (6) has, a thermochromic property.

19. Method according to claim 2, characterized in that the extra continuous strip of tape (61) can function as a bypass diode.

20. Method according to claim 3, characterized in that the extra continuous strip of tape (61) can function as a bypass diode.

* * * * *